United States Patent [19]

Hashimoto

[11] Patent Number: 4,954,994
[45] Date of Patent: Sep. 4, 1990

[54] FIFO MEMORY CAPABLE OF SIMULTANEOUSLY SELECTING A PLURALITY OF WORD LINES

[75] Inventor: Masahi Hashimoto, Garland, Tex.

[73] Assignee: Texas Instruments Incorporated, Dallas, Tex.

[21] Appl. No.: 245,833

[22] Filed: Sep. 16, 1988

[30] Foreign Application Priority Data

Sep. 18, 1987 [JP] Japan .................................. 62-234523

[51] Int. Cl.$^5$ ................................................ G11C 8/00
[52] U.S. Cl. ............................ 365/230.06; 365/238.5; 365/240; 365/221; 365/201
[58] Field of Search ................ 365/78, 221, 239, 240, 365/189, 236, 201, 230, 189.12, 230.06, 230.05, 238.5; 340/799, 800, 801; 371/21

[56] References Cited

U.S. PATENT DOCUMENTS

| | | | |
|---|---|---|---|
| 4,562,435 | 12/1985 | McDonough et al. | 340/799 |
| 4,670,878 | 6/1987 | Childers | 371/21 |
| 4,744,058 | 5/1988 | Kawashima et al. | 365/201 |
| 4,799,198 | 1/1989 | Ogawa | 365/221 |

FOREIGN PATENT DOCUMENTS

0128093  7/1983  Japan .................................... 365/201

OTHER PUBLICATIONS

Pai, "FIFO RAM Controller Tackles Deep Data Buffering", Computer Design, Aug. 1, 1986, pp. 109–112.
Tunick, "Rich with Logic, Memory ICs Hone Their Specialties", Electronic Design, Jun. 11, 1987, pp. 77–86.
"A 1Mb Dram with 33MHz Serial I/O Ports"–Ohta et al., IEEE International Solid-State Circuits Conference, pp. 274–275 (Feb. 21, 1986) with related product description 1 Mbit Image Memory MN4700 Product Description.
"1985 Memory Products Databook"–NEC Electronics Inc., μ PD41221 224, 000–Bit Serial–Access NMOS RAM, pp. 3–21 through 3–25 (Jan. 1985).
"1986 Memory Databook"–NEC Electronics Inc., μ PD41221 224,000-Bit Serial-Access NMOS RAM, pp. 3-25 through 3-31 (Apr. 1986).

*Primary Examiner*—Glenn A. Gossage
*Attorney, Agent, or Firm*—William E. Hiller; N. Rhys Merrett; Mel Sharp

[57] ABSTRACT

A semiconductor memory device is constructed so that a plurality of word lines may be simultaneously selected by the transfer of information through a plurality of shift register positions of a shift register, wherein the respective shift register positions are connected to individual word lines. Simultaneously with the selection of the word lines, data may be written in or readout from the memory. The shift register is part of an address decoder which also includes logic circuits providing first and second selector devices. The first selector device is connected between a control circuit and the initial shift register position, while the second selector device is connected between the control circuit and each of the plurality of shift register positions arranged in parallel. When the first selector device is activated by a first control signal from the control circuit, binary data is clocked through each of the shift register positions. Then, a second control signal activates the second selector device for producing an output signal to each of the shift register positions, thereby applying the information thereof to the word lines and simultaneously selecting those word lines corresponding to shift register positions in which a logic "1" has been stored.

5 Claims, 4 Drawing Sheets

4,954,994

FIFO MEMORY CAPABLE OF SIMULTANEOUSLY SELECTING A PLURALITY OF WORD LINES

BACKGROUND OF THE INVENTION

1. Field of the Invention

The present invention relates to semiconductor memory devices.

2. Description of the Prior Art

Heretofore, in the inspection of a semiconductor memory device, such as DRAM (dynamic RAM), for operability, an examination consisting of applying the write-in and readout of information for testing purposes to individual elements of such a device has been used.

The influence of such examination time on productivity, which is of limited impact for devices of relatively small memory capacity, becomes more and more important with increasing memory capacity. Currently, the enhanced memory capacity of a semiconductor memory device has resulted in the time taken for testing the operability of such a memory device to assume a high degree of significance in its effect on productivity. For example, it is said to take at least 1 minute for examining every 4 Mbit DRAM by a conventional technique, which indicates that testing procedure relying upon the testing of individual elements in separate stages cannot meet productivity demand from the viewpoint of mass production of semiconductor memory devices extremely large memory capacities.

OBJECTS AND SUMMARY OF THE INVENTION

It therefore is the principal object of the invention to provide a semiconductor memory device capable of being examined for operability in a minimized time.

To this end, the semiconductor memory device is provided with an externally-controllable address decoder able to simultaneously select simultaneously a plurality of word lines of the memory device in the production of a predetermined binary data bit pattern for a memory matrix comprising a plurality of word lines and a plurality of bit lines, wherein the binary data bit pattern is used for testing purposes.

Other objects, features and advantages of the invention will appear more fully from the following detailed description thereof taken in connection with the accompanying drawings.

DESCRIPTION OF THE PREFERRED EMBODIMENT

Figure 1:
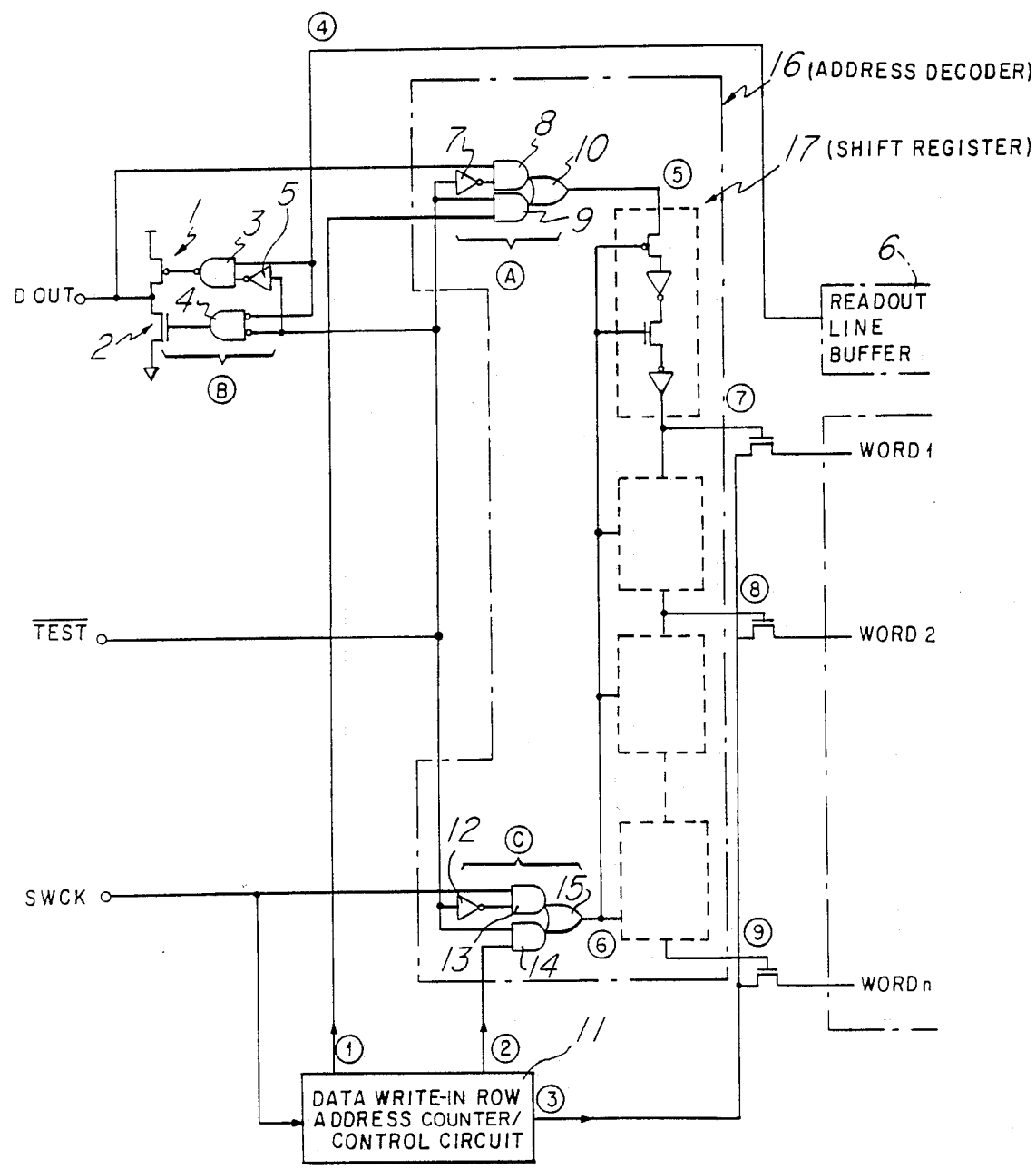
FIG. 1 is a diagrammatic circuit of a word line selective decoder for a semiconductor memory device in accordance with the present invention.

FIG. 1 is a fragmentary diagrammatic circuit of a word line selective decoder for a semiconductor memory device according to the invention, particularly showing the word line selective decoder as an address decoder 16 and the parts associated therewith.

In a write-in mode, a test terminal $\overline{Test}$ is at a binary logic level "1", and thus an output ④ of a readout line buffer 6 is output as an input signal to $D_{out}$ through an output buffer Ⓑ comprising MOS transistors 1 and 2, a NAND gate 3, an AND gate 4 and an inverter 5. A selector Ⓐ comprising an inverter 7, AND gates 8 and 9, and an OR gate 10 outputs to ⑤ upon receiving signal ① from a unit 11 comprising a row address counter and a control circuit. Another selector Ⓒ comprising an inverter 12, AND gates 13 and 14, and an OR gate 15 outputs to ⑥ upon receiving signal ② from the unit 11. The timing chart (FIG. 2) shows the timing relation between these signals and others during the operation of the semiconductor memory device in a normal mode. The data input through ⑤ is one-step shifted every m cycles of SWCK, in the order of ⑦, ⑧, ⑨, ..., to select word lines from No. 1 to No. n one after another in an ascending order.

Examination on the semiconductor memory device for operability is as follows: $\overline{Test}$ is changed to a "0" binary logic level and output buffer Ⓑ is disconnected from $D_{out}$. At the same time, the information, in other words, signals to select target word lines, is input from $D_{out}$ and transmitted to ⑤ through selector Ⓐ, whereby the selection of any word line to be tested is made.

Selector Ⓒ supplies to ⑥ the write-in cycle control (SWCK) signals, which provoke the patterns input from ⑤ to enter in sequence the plurality of shift register positions of a shift register 17.

Figure 2:
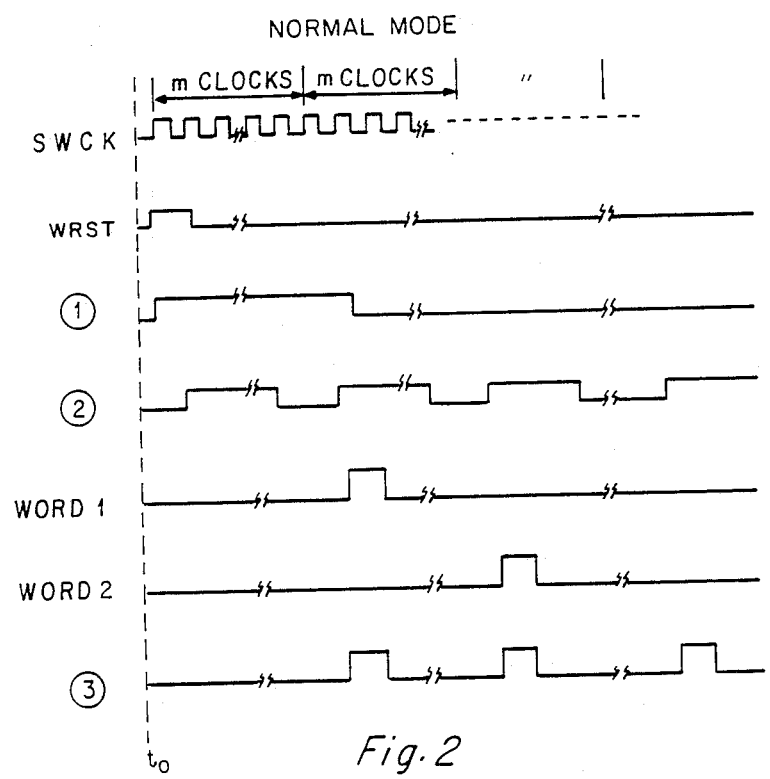
FIG. 2 is a timing chart for the semiconductor memory device when operated in a normal mode.
Figure 3:
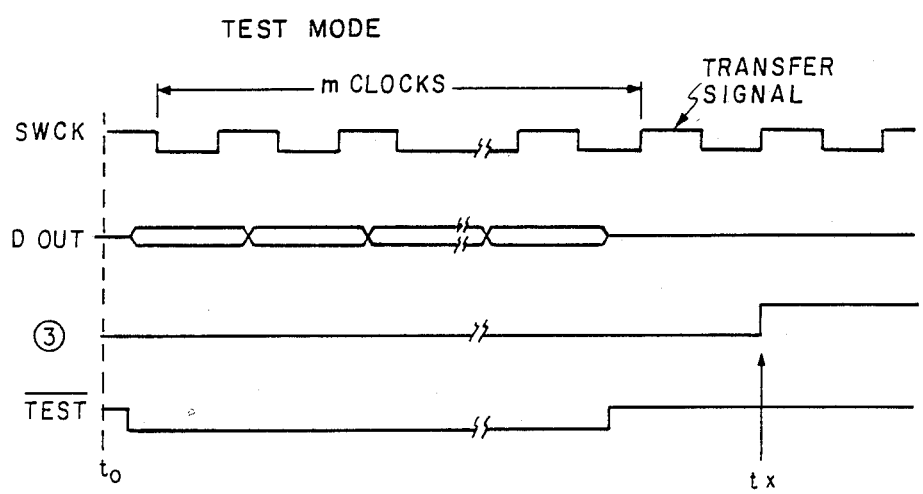
FIG. 3 is a timing chart for the semiconductor memory device when operated in a test mode.

FIG. 3 is a test mode timing chart for the semiconductor memory device, wherein the timing chart is shown in an enlarged time scale as compared with that in FIG. 2.

Figure 4:
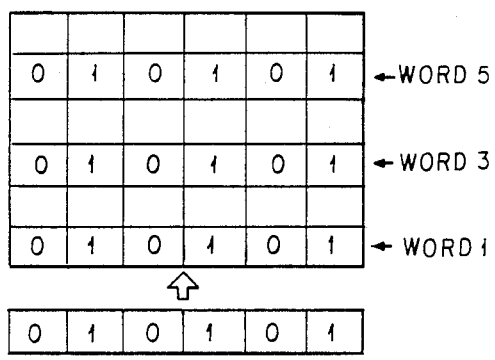
FIG. 4 shows the beginning sequence in the write-in of a checker board pattern.

As described above, in response to inputs from $D_{out}$, the transfer of information to the shift register 17 is caused, and this enables simultaneous selection of a plurality of target word lines, various selections being possible. By changing $\overline{Test}$ to "1" and setting ③ to "1" at $t_x$, normal-mode write-in (or readout) of data is possible while the word lines as selected in the above-stated manner are ON. That is, the write-in of column data can be carried out under the same timing as the selection of word lines. Thus simultaneous checking on a plurality of word lines can be made. The write-in of a checker board pattern in a memory array is carried out, for example, as follows: a data sequence of 010101 is written in a write line buffer from $D_{in}$ terminal in synchronism with SWCK, and under the same timing, a write-in from $D_{out}$ terminal is carried out in such a pattern that alternate ones of the word lines are set to "1", such as Nos. 1, 3, 5, .... Then, beginning at the time $t_x$ indicated in FIG. 3, data is written in the memory array as shown in FIG. 4. Subsequently, a data sequence 1010 ... is written in the line buffer and at the same time signals are input from $D_{out}$ so that the selection of alternate word lines 2, 4, 6 ... is carried out. This data is written in the memeory array beginning at the time of the next $t_x$. Thus the checker board pattern becomes completed for test purposes.

A semiconductor memory device, for instance, of 1 Mbits in capacity and correspondingly usually having 1024 word lines, when constructed in accordance with the present invention requires a total time for writing a checker board pattern in the memory array thereof for test purposes as small as 2/1024≈1/500 less than does a conventional semiconductor memory having a similar storage capacity.

Figure 5:
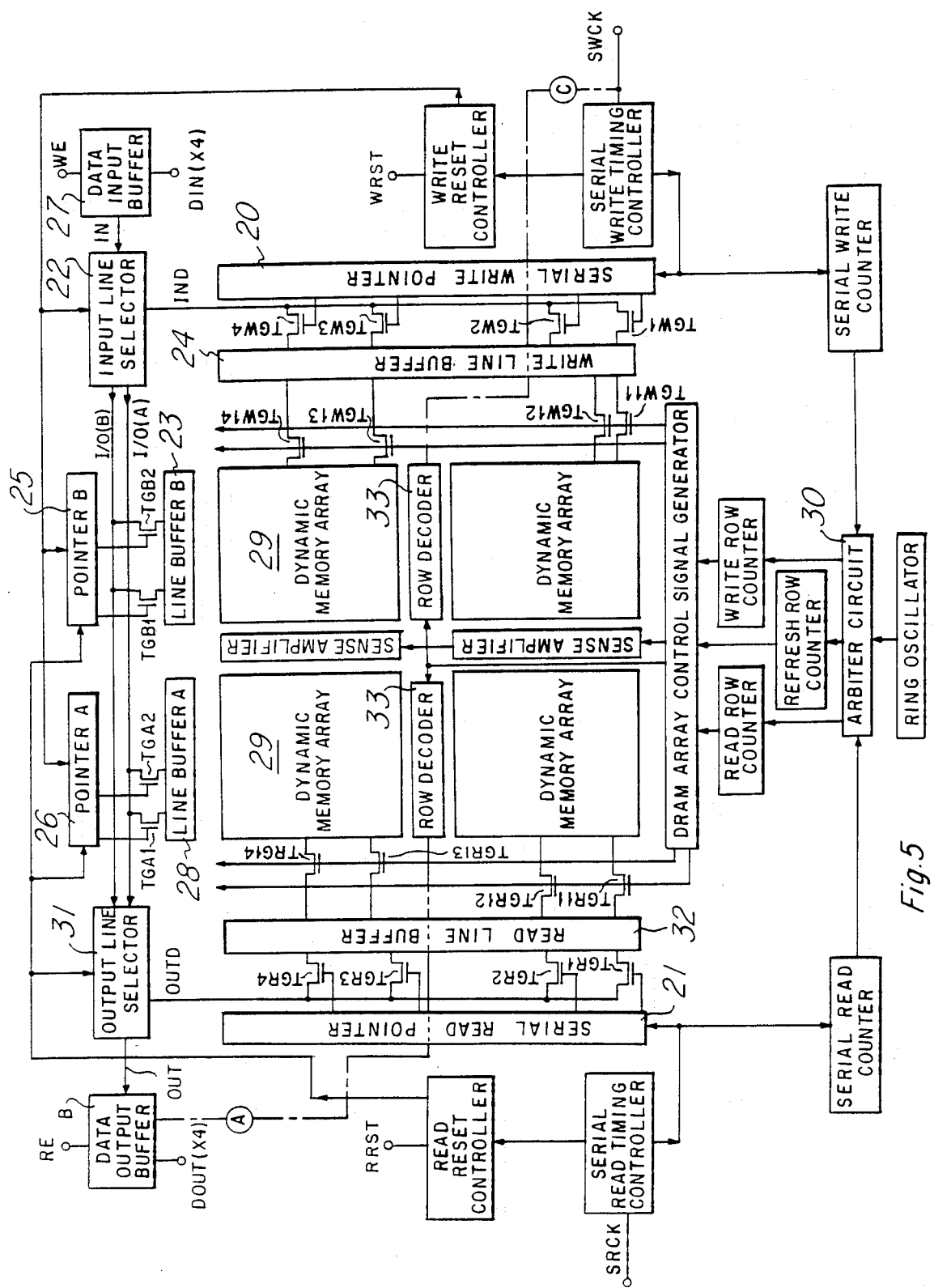
FIG. 5 is a block diagram schematically illustrating a FIFO memory device having row decoders operable as word line selective decoders in accordance with FIG. 1.

The address decoder of FIG. 1 as described is used as a row decoder for memory arrays such as included in a semiconductor memory device as shown in FIG. 5, which will be described in detail hereinafter.

The semiconductor memory device of FIG. 5 is a FIFO (First-in, first-out) memory which is constructed to readout information in the same order as it has been written-in. For the selection of column addresses of the memory element array is responsible, address pointers (a serial write pointer 20 and a serial read pointer 21) which are in the form of shift registers are used. The address pointers also perform row address selection. In the memory, as indicated by phantom lines, the selector Ⓐ is connected as a part of the row decoder (address decoder) 33 to the output buffer Ⓑ, and the selector Ⓒ is connected as a part of the row decoder (address decoder) 33 to the SWCK terminal.

In the following description, of the operation procedure of the FIFO memory device shown in FIG. 5 will be set forth, wherein data write and readout shall be carried out independently of each other unless otherwise specified.

Referring to FIG. 5, as long as the external input signal for controlling data-write "WE" stays at a high level, "H", input data from the data input terminal $D_{in}$ is written as effective data into the device. The write reset signal WRST is an input signal with the rising edge thereof indicating a return to the first address of data, while the clock signal SWCK, provides a write cycle time regulating clock to time the data write cycle.

As long as the external input signal RE for controlling data output is kept high "H", data is read out from the data output terminal $D_{out}$ in synchronism with the serial read clock signal SRCK.

The read reset signal RRST is an input signal with the rising edge thereof indicating a return to the first address of data.

DATA WRITE OPERATION (1) When WRST signal is caused to change from low level, "L", to "H", the data write address is reset to zero, and the devise begins a set of operations: the concerned circuit detects the rising edge of WRST and signaled to an input line selector 22, which then operates so that I/O(A) is connected to IN and I/O(B) and IND get disconnected from line IN. Simultaneously, data transfer gates $T_{GB1}$ and $T_{GB2}$ of a line buffer B 23 are turned OFF the line I/O(B) and also data transfer gates $T_{GW1}$ through $T_{GW4}$ of a write line buffer 24 are turned OFF the line IND. Thus a pointer B 25 and a serial write pointer 20 become reset while a pointer A 26 indicates the address "0", that is, the data transfer gate $T_{GA1}$ now turns ON. As the result, data transmitted from a data input buffer 27 via the lines IN and I/O(A) to the line buffer A 28, and written at address "0" of it.

(2) In synchronism with SWCK clock, data is sequentially written successive address of line buffer A 28.

(3) As a line buffer A 28 gets full with data written at all the available address thereof, a data transmission route switching request is sent from a pointer A 26 to the input line selector 22, which changes the connection of the line IN from the line I/O(A) into the line IND.

(4) In synchronism with SWCK clock, the serial write pointer 20 sequentially turns ON data transfer gates $T_{GW1}$ through $T_{GW4}$ of the write line buffer 24 so that input data from the $D_{in}$ is written in the write line buffer 24.

(5) The moment the serial write pointer 20 turns ON the $T_{GW3}$, a write request signal "WRQ" is generated and transmitted to an arbiter circuit 30 to write the data stored in the first half of the write line buffer 24 into a dynamic memory array 29.

(6) Subsequently, by increment of the row decoder address one by one, serial write of data can continue until the maximum capacity of DRAM.

If generated in the course of this, another WRST signal is likewise transmitted to the input line selector 22, but with the result of the connection of I/O(B) to the line IN and the turn-OFF of the lines I/O(A) and IND from the line IN. When line buffer B 23 thus gets full with data written at all the available addresses, like under the previous (3), the line I/O(B) is turned OFF the line IN, and the line IND is connected to the line IN, thus data write proceeding as mentioned above.

Upon input of the next WRST signal, the line IN is connected to the line I/O(A). As understood from the above-stated, connection of the line I/O(A) or I/O(B) to the line IN is switched every input WRST signal which acts as if a toggle switch.

Both line buffers A 28 and B 23 are composed of full-static memory elements, the reason for which will be given in the following description of the data read operation in which the construction is involved more closely.

DATA READOUT OPERATION

Data read operation will be described below:

(1) RRST signal is changed from "L" to "H" to reset the data read address to zero inside the device. Internally, the edge of the RRST signal is detected and signaled to the output line selector 31 and arbiter circuit 30. Then the output line selector 31 connects either the line I/O(A) or I/O(B) to the line OUT. When data is being written through one of them, connection to the other can be established. This means retrieval of readout of old data when the time interval between WRST and RRST signals is within a predetermined range, and, as mentioned later, is useful for preventing conflict with the readout operation of data stored in the dynamic type main memory element portion. In the case where neither the line I/O(A) nor I/O(B) in connected to the line IN, one of these that has been used by the last WRST signal is connected to the line OUT. This means readout of new data, that is, the same data will be always repeatedly read out until the next WRST signal is generated. Owing to an external signal input by the operator, generation of RRST signal is out of the predictable range. For quick response to RRST signal is suitable static memory which allows to read data fast, and is adopted in the present example. Though the static type memory design lowers the degree of circuit integration, it gives a negligibly small effect on the total dimensions of the device, taking into consideration that the line buffers A 28 and B 23 may have a memory capacity of around 100 bits.

On the other hand, RRST signal transmitted to arbiter circuit 30 generates a read request signal RRQ, in response to the signal, necessary data being read from dynamic memory array 29 into a readout line buffer 32 within a necessary time interval, thereby the readout of these data can follow the current readout, just after completion of readout of all the data from line buffer A 28 or B 23.

(2) In synchronism with the clock SRCK from the line buffer A 28 or B 23, data is serially read out until the last address of it.

(3) A data transmission route switch request is then transmitted from pointer A 26 or B 25 to the output line selector 31 to connect the line OUTD to the line OUT.

(4) since the first half of the readout line buffer 32 has been loaded with data to be read out already at the step (1), data is now continuously read out through the line OUT without any interruption. The moment the read pointer 21 turns ON the $T_{GR1}$, another read request RRQ is generated and applied to arbiter circuit 30 to readout necessary data from dynamic memory array 29 to the second half of the readout line buffer 32.

It is noted that the same serial data can be read out every input of the signal RRST.

The description of the basic operation has been now completed.

With an ideal FIFO memory, data readout and write could have been completely asynchronously. Owing to the limited memory capacity associated with the actual device, however data readout and write cannot carried out without any restriction.

For easier understanding of reading video data into FIFO memory device according to the invention and reading-out it from the device, an explanation will be given by way of an example. It is herein assumed that this memory device has a memory capacity corresponding to a frame of video data (In Japan the NTSC system is adopted that a frame of video screen image is composed of 525 scanning lines).

As a frame of video data is sequentially written from the first to the last data thereof, the above memory device gets full. If further video data is input serially to the device, overwrite is carried out successively from the top address to create the second frame. Of course, if the WE signal is set to "low" to prohibit data write of the second and subsequent frames, the first frame of video data is kept stored and the same data can be read out repeatedly in the same data readout procedure.

The above-explained circuit configuration of FIG. 5 may be modified very readily, for example, so that when the memory gets full, this can be signaled from the inside to the operator, or so that the same internal state as at low level of signal WE may be created, thereby overwrite can be prevented.

With the configuration of FIG. 5, in the case data is written continuously as mentioned above, either the preceding frame (old data) or the current frame (new data) that is being written can be readout under the timing of the RRST signal relative to the last WRST signal. The timing interval is determined in accordance with the memory capacity of line buffers A or B. For example, if a RRST signal is generated within 100 SWCK clock cycles after the output of WRST signal, on assumption that buffer A has a memory capacity of 100 bits, then readout of old data results.

Generation of a RRST signal after more than 100 SWCK clock cycles following the output of a WRST signal does not always retrieve readout of new data. Alternatively the times taken for data transfer from the write line buffer to the memory array and from the latter to the read line buffer are involved in.

In detail, letting the memory capacities of the write and read line buffers be each 200 bits, new data will be read out under the following conditions:

Assuming that the first 100 bits of the new frame data are written in line buffer A and the next 100 bits from 101th through 200th bit of the new frame data are written in the write line buffer at addresses 1 through 100. The moment the 201th bit is written at address 101 of the write line buffer, a write request WRQ is generated (as mentioned above). Since data transfer to the memory array has been already complete before the 301th bit is written, the output of a readout request RRQ for data transfer of 101th bit through 200th bit from the memory array to the read line buffer may be admitted, resulting in input of a RRST signal as mentioned above.

Namely new data can be retrieved to be read out if a signal RRST is output after more than 300 SWCK clock cycles following the generation of a WRST signal (after 300 bits of data have been written).

It must not to be allowed for RRST signal to output within the range of 100 to 300 SWCK clock cycles after generation of the last WRST signal because determination whether the old or new data shall be readout is impossible in this time range.

Since data write and readout can be performed asynchronously, the clock pulse widths of SWCK and SRCK can be changed freely. Also in this case, assuming that SWCK and SRCK at occurrence of WRST and RRST are of 0 cycle, respectively. No confusion can occur mixing of old and new datas, so far as clocks SWCK and SRCK are set to such pulse widths that the request of $m-n \leq 100$ or $m-n \geq 300$ is always met, wherein m is the mth cycle of SWCK and n is the nth cycle of SRCK.

As apparent from the above-described circuit configuration, basically the same procedure as known VRAMs can be applied to incorrect-bit relief, circuits, and thus its explanation is omitted.

It will be evident that various modifications can be made to the described embodiment without departing from the scope of the present invention.

For example, the construction and elements of the word line selective decoder may be modified or changed. The present invention can also be applied particularly to DRAMs which normally require a relatively long time to be taken for writing information in the memory elements of the memory array, and widely to various types of device's such as EPROMs.

The present invention in a semiconductor memory device provided with an address decoder capable of simultaneously selecting a plurality of word lines, has the effect that by inputting, as required, one external signal of word line (row) selection information, and by providing a command for a write-in (or readout) of information, the necessary information is simultaneously written into (or readout from) a plurality of memory elements, and thus brings about the advantage of a significant reduction in the time taken for the write-in or readout of a test pattern for establishing the operability of the memory device.

What is claimed is:
1. A semiconductor memory device comprising:
   a plurality of word lines;
   a readout line buffer;
   an output buffer connected to said readout line buffer for receiving the output therefrom;
   control circuit means including a data write-in row address counter and having a plurality of outputs, one of which is connected to each of said plurality of word lines;
   at least one address decoder including shift register having a plurality of successive shift register positions respectively connected to corresponding individual word lines, first selector means connected between one of the outputs of said control circuit means and the initial shift register position of said shift register for receiving a first control signal from said control circuit means, and second selector means connected between another output of said control circuit and each of the plurality of shift register positions arranged in parallel for receiving a second control signal from said control circuit means;

binary data as applied to said shift register being successively shifted through each of said plurality of shift register positions in response to said first control signal activating said first selector means to provide a series of output signals as binary data in one of two binary logic states for storage in the initial shift register position and in each of the remaining shift register positions;

one of the two binary logic states if stored in a respective shift register position designating the selection of the word line corresponding thereto, and the other of the two binary logic states if stored in a respective shift register position designating the non-selection of the word line corresponding thereto; and each of shift pluality of word lines corresponding to a respective shift register position having said one binary logic state stored therein being selected so as to be conductive in response to said second control signal activating said second selector means to provide an output signal to each of said shift register positions simultaneously.

2. A semiconductor memory device as set forth in claim 1, further including a data output terminal connected to the output of said output buffer and to an input of said first selector means;

a test signal terminal connected to one input of said first selector means and to one input of said output buffer, said test signal terminal being adapted to receive a binary test signal in one of two binary logic states;

a binary test signal from said test signal terminal at one of the two binary logic states activating said output buffer to enable the output from said readout line buffer to be provided to said data output terminal via said output buffer;

a binary test signal from said test signal terminal at the other of the two binary logic states deactivating said output buffer to disconnect said readout line buffer from said data output terminal; and the binary data as applied to said shift register in response to said first control signal activating said first selector means being initially input to said data output terminal for transmission to said input of said first selector means connected thereto when the binary test signal from said test signal terminal is at the other of the two binary logic states.

3. A semiconductor memory device as set forth in claim 2, wherein said memory device is capable of FIFO operation, and includes a write-in cycle control terminal;

said address decoder comprising a row decoder of said FIFO memory device, said first selector means being connected as part of said row decoder to said output buffer, and said second selector means being connected as part of said row decoder to said write-in cycle control terminal.

4. A semiconductor memory device as set forth in claim 2, wherein said control circuit means is effective to provide a third control signal at said one binary logic state on said one output connected to each of said plurality of word lines;

each of said selected word lines receiving write-in data at said one binary logic state as provided by said third control signal such that preselected binary data patterns may be written into a memory array defined by a matrix of intersecting word lines and bit lines.

5. A semiconductor memory device as set forth in claim 4, wherein each of said selected word lines receives write-in data at said one binary logic state simultaneous to the selection thereof.

* * * * *